United States Patent
Ikeda (12)

(10) Patent No.: US 6,557,715 B2
(45) Date of Patent: May 6, 2003

(54) FITTING STRUCTURE FOR ELECTRONIC APPARATUSES OF A HIGH PRODUCTIVITY

(75) Inventor: Tomoki Ikeda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/849,960

(22) Filed: May 4, 2001

(65) Prior Publication Data

US 2001/0039143 A1 Nov. 8, 2001

(30) Foreign Application Priority Data

May 8, 2000 (JP) ........................................ 2000-139411

(51) Int. Cl.⁷ ................................................. B65D 6/28
(52) U.S. Cl. ..................................................... 220/4.02
(58) Field of Search ............................... 220/4.33, 4.02, 220/4.28, 3.92, 3.94, 622, 692, 693; 439/607

(56) References Cited

U.S. PATENT DOCUMENTS 5,718,605 A   2/1998   Morikawa et al.

FOREIGN PATENT DOCUMENTS

JP   2000-114734   4/2000
JP   2000-223858   8/2000

*Primary Examiner*—Stephen Castellano
(74) *Attorney, Agent, or Firm*—Brinks Hofer Gilson & Lione

(57) ABSTRACT

The object of the present invention is to provide highly productive and yet low-cost products. To this end, the fitting structure for electronic apparatuses according to the present invention fastens at the same time the fastening section. If integral with the housing 1 and fastening pieces 2c integral with the first cover 2 to the chassis 4 by means of screws 6 and brings the flat plate section 2a of the first cover 2 to the opening edge 1d of the housing 1 by the clamping of screws 6, thereby, the first cover 2 can be brought into tight contact with the housing 1 at the same time as the electronic apparatus is fastened by screws, removing the necessity of twisting operations which had formerly been required, and highly productive and yet low-cost products can be provided.

4 Claims, 2 Drawing Sheets

FITTING STRUCTURE FOR ELECTRONIC APPARATUSES OF A HIGH PRODUCTIVITY

BACKGROUND OF THE INVENTION

1. Field of the Invention

This invention relates to a fitting structure suitable for use on CATV transmitters and other high-frequency apparatuses.

2. Description of Related Art

A prior fitting structure for use on CATV transmitters and other high-frequency apparatuses will be explained by referring to FIGS. 3 and 4. A box-type housing made of metal plate 21 includes a rectangular side wall 21c with openings 21a and 21b on one side and the opposite side facing thereto, a plurality of T-shape protuberances 21f and 21g for fastening by twisting and bulging up and downward from the edges 21d and 21e of opening of this side wall 21c, fastening section 21h formed by bending at the right angle the metal plate integral with the side wall 21c in the side wall 21c facing each other, and holes 21j drilled through the fastening section 21h.

And this housing 21 houses a circuit substrate not shown here and on which various electric components are mounted to create a desired circuit.

The first and second covers 22 and 23 made of a metal plate include respectively rectangular flat plate sections 22a and 23a, side plates 22b and 23b formed by bending the four edges of the flat plate sections 22a and 23a, and a plurality of holes 22c and 23c drilled through the flat plate sections 22a and 23a at positions close to the side plates 22b and 23b.

And the first cover 22 is fitted by covering the opening 21a with the flat plate section 22a, by having the side plate 22b fit on the side wall 21c from outside and by letting the protuberances 21f protrude from the holes 22c so that the first cover 22 would cover the housing 21.

Then, the T-shape protuberances 21f protruding from the holes 22c are twisted to press the flat plate section 22a to the opening edge 21d by the action of the protuberances 21f and to fasten the first cover 22 to the housing 21.

The above construction assures the grounding between the housing 21 and the first cover 22.

And the second cover 23 is mounted by covering the opening 21b with the flat plate section 23a, fitting the side plate 23b on the side wall 21c from outside and by letting the protuberances 21g protrude from the holes 23c so that the second cover 23 would cover the housing 21.

Then, the T-shape protuberances 21g protruding from the holes 23c are twisted to press the flat plate section 23a to the opening edge 21e by the action of the protuberances 21g and to fasten the second cover 23 to the housing 21.

The above construction assures the grounding between the housing 21 and the second cover 23.

And this is the way electronic apparatuses are built.

For transmitters and other similar sets, a chassis 24 for mounting electronic apparatuses is used, and on this chassis 24 a plurality of mounting supports 25 provided each with a tapped hole 25a are fixed.

And electronic apparatuses is mounted by driving screws 26 into tapped holes 25a through holes 21j while the fastening section 21h integral with the housing 21 are placed on the mounting supports 25 and by fastening the fastening section 21h with screws 26.

The prior fitting structure for electronic apparatuses, which fastens the fastening section 21h with screws to the mounting supports 25 while the first and second covers 22 and 23 remain fastened to the housing 21, requires twisting operations for fastening the first and second covers 22 and 23, and the ensuing complicated nature of the operations was an issue that lowered productivity and lead to high costs.

SUMMARY OF THE INVENTION

It is therefore an object of the present invention to provide a highly productive and yet low-cost fitting structure for electronic apparatuses.

The first solution for solving said issue is a fitting structure that includes a box-type housing provided with at least an opening on one side, fastening section integral with this housing, the first cover covering said opening and a chassis to which said housing is fastened with screws, said first cover including a flat plate section covering said opening and fastening pieces extending from and integral with this flat plate section, said fastening section integral with said housing and said fastening pieces of said first cover being fastened at the same time with said screws to said chassis, and said flat plate section being tightly in contact with the opening edge of said housing.

The second solution is a fitting structure in which said chassis includes mounting supports provided respectively with a tapped hole, to which said fastening section integral with said chassis and said fastening pieces are fastened with screws.

The third solution is a fitting structure that provides the second cover including a flat plate section and fastening pieces extending from and integral with said flat plate section, said housing having an opening on the other side facing with said one side, said opening on the other side being covered with said flat plate section of said second cover, said fastening pieces sandwiching said fastening section are fastened with said screws to bring the respective flat plate section of said first and second covers into tight contact with the opening edge of said housing.

The fitting structure for electronic apparatuses according to the present invention, which fastens with screws 6 at the same time the fastening section 1f integral with the housing 1 and the fastening pieces 2c extending from the first cover 2 to the chassis 4 and brings the flat plate section 2a of the first cover 2 into tight contact with the opening edge 1d of the housing 1 as a result of screwing the screw 6, can bring the first cover 2 into tight contact with the housing 1 at the same time as the screwing of the electronic apparatus. Thus, twisting operations required heretofore according to the prior method are no longer necessary, productivity is enhanced and production costs are reduced.

And the provision of mounting supports 5 provided each with a tapped hole 5a on the chassis 4 so that the fastening section 1f and the fastening pieces 2c can be fastened with screws onto these mounting supports 5 enables to adapt easily to the requirements without changing the construction of the prior chassis 4.

And by providing the second cover 3 consisting of a flat plate section 3a and fastening pieces 3c extending from this flat plate section 3a, by creating an opening 1b on the other side facing with one side of the housing 1, by covering the opening 1b on the other side with the flat plate section 3a of the second cover 3, by fastening with screws 6 the fastening pieces 2c and 3c sandwiching the fastening section 1f and by thus bringing the respective flat plate sections 2a and 3a of the first and second covers 2 and 3 into tight contact with the opening edges 1d and 1e of the housing 1, the first and second covers 2 and 3 can be brought into tight contact with the housing 1 at the same time as the screwing of the electronic apparatus, and therefore productivity can be further enhanced and costs can be reduced.

DETAILED DESCRIPTION OF PREFERRED EMBODIMENTS

Figure 1:
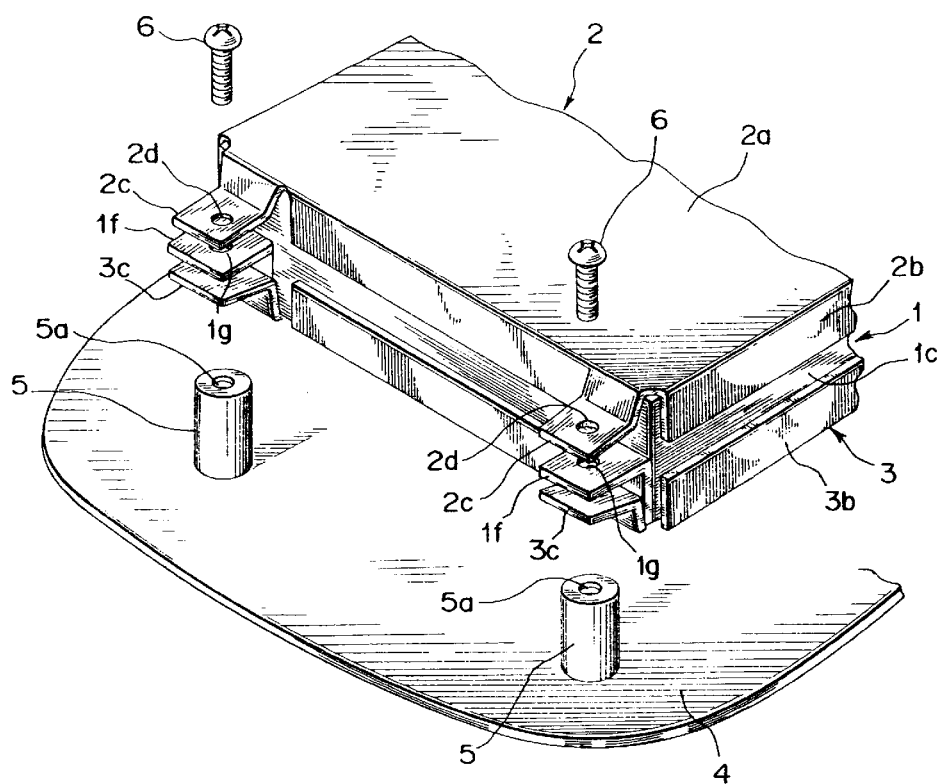
FIG. 1 is a partial exploded perspective view showing the fitting structure for electronic apparatuses according to the present invention.
Figure 2:
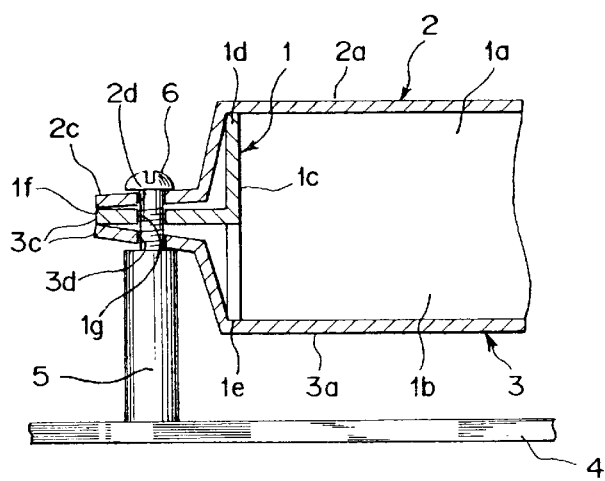
FIG. 2 is a partial cross-sectional view showing the fitting structure for electronic apparatuses according to the present invention.
Figure 3:
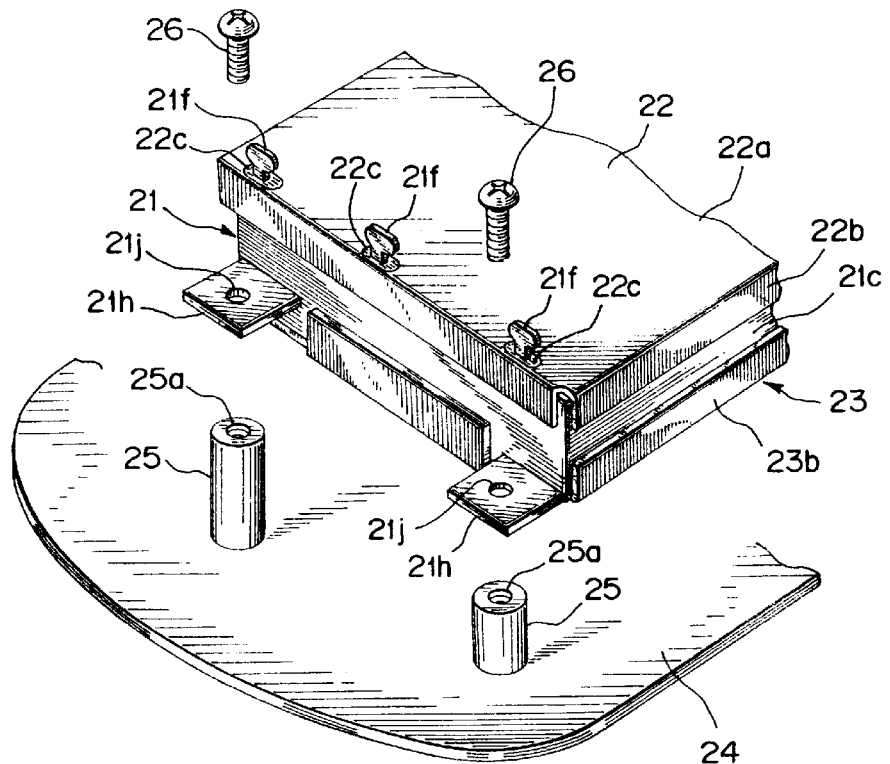
FIG. 3 is a partial exploded perspective view showing the prior fitting structure for electronic apparatuses.
Figure 4:
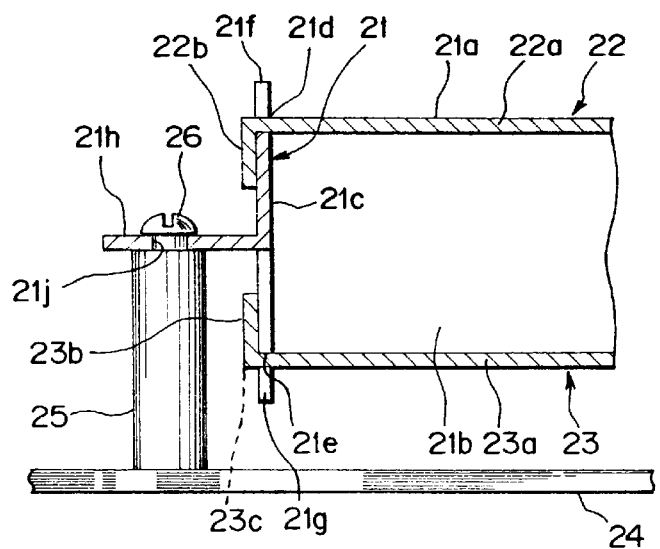
FIG. 4 is a partial cross-sectional view showing the prior fitting structure for electronic apparatuses.

By way of explanation on the drawings showing the fitting structure for electronic apparatuses used in CATV transmitters according to the present invention, FIG. 1 is a partial exploded perspective view showing the fitting structure for electronic apparatuses according to the present invention, and FIG. 2 is a partial cross-sectional view showing the fitting structure for electronic apparatuses according to the present invention.

The construction of the fitting structure for electronic apparatuses according to the present invention will be explained below by referring to FIGS. 1 and 2. A box-type housing 1 made of a metal plate includes a rectangular side walls 1c with openings 1a and 1b on one side and on the opposite side facing thereto, opening edges 1d and 1e located at the outer periphery of openings of these side walls 1c, a plurality of fastening sections 1f formed by bending a metal plate at the right angle from the side walls 1c in the side walls 1c facing each other, and holes 1g bored in the fastening section 1f.

And this housing 1 houses a circuit substrate not shown here on which a variety of electric components are mounted to form a desired circuit.

First and second covers made of a metal plate 2 and 3 respectively include rectangular flat plate sections 2a and 3a, side plates 2b and 3b formed by bending the four sides of the flat plate sections 2a and 3a, a plurality of generally "<"-shaped fastening pieces 2c and 3c connected with the flat plate sections 2a and 3a and extending from the flat plate sections 2a and 3a, and holes 2d and 3d bored near the tip of these fastening pieces 2c and 3c.

And the first cover 2 covers the opening 1a with its flat plate section 2a, and envelopes the housing 1 by having the side plate 2b fit on the side wall 1c from outside.

And the second cover 3 covers the opening 1b with its flat plate section 3a, and envelopes the housing 1 by having the side plate 3b fit on the side wall 1c from outside.

At this time, the fastening pieces 2c and 3c integral with the first and second covers 2 and 3 sandwich the fastening section 1f integral with the housing 1 from above and beneath, and the foregoing is the way electronic apparatuses are built.

In case of transmitters and other similar sets, a chassis 4 for mounting electronic apparatuses is used, and this chassis 4 is provided with a plurality of mounting supports 5 provided each with a screw hole 5a.

And electronic apparatuses are mounted as shown in FIG. 2 by disposing the fastening pieces 2c and 3c and the fastening section 1f on the mounting supports 5, by inserting screws 6 on holes 2d and 3d of the fastening pieces 2c and 3c and the hole 1g of the fastening piece, by driving the screws 6 into the tapping holes 5a and by fastening at the same time both the fastening pieces 2c, 3c and the fastening section 1f with screws.

And when the electronic apparatus is screwed down, the screwing of the screws 6 draws closer the fastening pieces 2c and 3c and brings the flat plate sections 2a and 3a of the first and second covers 2 and 3 into tight contact with the opening edges 1d and 1e of the side walls ensuring the earthing of the first and second covers 2 and 3 to the housing 1.

In the meanwhile, in the embodiment described above, the case in which two covers, i.e. the first and second covers 2 and 3, are used is explained. But a variation in which only a cover is used is also possible, and the mounting support 5 can be removed so that the electronic apparatus may be mounted directly to the chassis 4 with screws.

What is claimed is:

1. A fitting structure comprising:

a box-type housing with an opening at least on one side;

a fastening section integral with the housing;

a first cover covering said opening; and a chassis to which said housing is mounted by means of screws, wherein said first cover includes a flat plate section covering said opening and fastening pieces extending from the flat plate section, wherein the fastening pieces are inclined with respect to the flat plate section, said fastening section integral with said housing and said fastening pieces integral with said first cover are fastened at the same time by means of said screws to said chassis, and the clamping of said screws brings said flat plate section into tight contact with an opening edge of said housing such that an inclined clearance is arranged between said fastening pieces and said fastening section.

2. The fitting structure for electronic structures according to claim 1, wherein said chassis is provided with mounting supports provided each with a tapping hole, to which mounting supports said fastening section and said fastening pieces are fastened with screws.

3. The fitting structure for electronic structures according to claim 1 further comprising:

a second cover including a flat plate section and fastening pieces extending from the flat plate section of the second cover and inclined with respect to the flat plate section, wherein an opening is created on another side facing said one side of said housing, said opening on the other side is covered with said flat plate section of said second cover, said fastening pieces sandwiching said fastening section are clamped by means of said screws, and the fastening section of said housing is provided a clearance inclined between the fastening pieces for said first and second covers by fastening of said screws to bring said respective flat plate sections of said first and second covers in tight contact with the opening edge of said housing.

4. The fitting structure for electronic structures according to claim 2 further comprising:

a second cover including a flat plate section and fastening pieces extending from the flat plate section of the second cover and inclined with respect to the flat plate section, wherein an opening is created on another side facing said one side of said housing, said opening on the other side is covered with said flat plate section of said second cover, said fastening pieces sandwiching said fastening section are clamped by means of said screws, wherein the clamping of the fastening pieces arranges the fastening pieces in an inclined manner that includes an inclined clearance between the fastening pieces for said first and second covers to bring said respective flat plate sections of said first and second covers into tight contact with the opening edge of said housing.

* * * * *

UNITED STATES PATENT AND TRADEMARK OFFICE
CERTIFICATE OF CORRECTION

PATENT NO.     : 6,557,715 B2
DATED          : May 6, 2003
INVENTOR(S)    : Tomoki Ikeda It is certified that error appears in the above-identified patent and that said Letters Patent is hereby corrected as shown below:

<u>Title page,</u>
Item [57], ABSTRACT,
Line 4, delete "section. If" and substitute -- section 1F -- in its place.

Signed and Sealed this

Second Day of September, 2003

JAMES E. ROGAN
*Director of the United States Patent and Trademark Office*